United States Patent
Dede

(10) Patent No.: US 11,183,624 B2
(45) Date of Patent: Nov. 23, 2021

(54) ELECTRONIC ASSEMBLIES INCORPORATING HEAT FLUX ROUTING STRUCTURES FOR THERMOELECTRIC GENERATION

(71) Applicant: Toyota Motor Engineering & Manufacturing North America, Inc., Plano, TX (US)

(72) Inventor: Ercan Mehmet Dede, Ann Arbor, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 203 days.

(21) Appl. No.: 16/214,607

(22) Filed: Dec. 10, 2018

(65) Prior Publication Data

US 2019/0109270 A1 Apr. 11, 2019

Related U.S. Application Data

(63) Continuation of application No. 14/826,461, filed on Aug. 14, 2015, now Pat. No. 10,193,047.

(51) Int. Cl.
*H01L 35/30* (2006.01)
*H01L 35/32* (2006.01)

(52) U.S. Cl.
CPC .............. *H01L 35/30* (2013.01); *H01L 35/32* (2013.01)

(58) Field of Classification Search
CPC .... H01L 35/30; H01L 35/32; F28D 15/00–06
USPC ....................................................... 136/205
See application file for complete search history.

(56) References Cited

U.S. PATENT DOCUMENTS

| | | | |
|---|---|---|---|
| 7,436,059 B1 * | 10/2008 | Ouyang | .................. H01L 23/34 257/712 |
| 7,875,791 B2 | 1/2011 | Leonov et al. | |
| 7,924,569 B2 | 4/2011 | Letz | |
| 8,516,831 B2 | 8/2013 | Dede | |
| 9,125,299 B2 * | 9/2015 | Wittenberg | ........... H01L 23/367 |

(Continued)

OTHER PUBLICATIONS

Dede et al, Thermal-composite design optimization for heat flux shielding, focusing, and reversal, Structural and Multidisciplinary Optimization, Springer-Verlag Berlin Heidelberg (2013).

(Continued)

*Primary Examiner* — Magali P Slawski
*Assistant Examiner* — Kourtney R S Carlson
(74) *Attorney, Agent, or Firm* — Dinsmore & Shohl LLP

(57) ABSTRACT

Electronic assemblies for thermoelectric generation are disclosed. In one embodiment, an electronic assembly includes a substrate having a first surface and a second surface, and a conductive plane and a plurality of thermal guide traces position on the first surface of the substrate. The conductive plane includes a plurality of arms radially extending from a central region. The plurality of thermal guide traces surrounds the conductive plane, and is shaped and positioned to guide heat flux present on or within the substrate toward the central region of the conductive plane. The electronic assembly may also include a thermoelectric generator device thermally coupled to the central region of the conductive plane, and a plurality of heat generating devices coupled to the second surface of the substrate.

19 Claims, 6 Drawing Sheets

(56) References Cited

U.S. PATENT DOCUMENTS

| | | |
|---|---|---|
| 9,379,039 B2 * | 6/2016 | Lam .................... H01L 23/4006 |
| 2004/0177876 A1 | 9/2004 | Hightower |
| 2010/0081191 A1 | 4/2010 | Woods |
| 2012/0192574 A1 * | 8/2012 | Ghoshal .............. F28D 15/0266 62/3.2 |
| 2014/0174495 A1 | 6/2014 | Nakaya |
| 2014/0318758 A1 | 10/2014 | Dede et al. |

OTHER PUBLICATIONS

Dede et al, Heat flux cloaking, focusing, and reversal in ultra-thin composites considering conduction-convection effects, Applied Physics Letters, AIP Publishing LLC (2013).

* cited by examiner

ELECTRONIC ASSEMBLIES INCORPORATING HEAT FLUX ROUTING STRUCTURES FOR THERMOELECTRIC GENERATION

CROSS-REFERENCE TO RELATED APPLICATION

This application is a continuation of and claims priority to U.S. patent application Ser. No. 14/826,461, filed Aug. 14, 2015 and entitled "ELECTRONIC ASSEMBLIES INCORPORATING HEAT FLUX ROUTING STRUCTURES FOR THERMOELECTRIC GENERATION," the entire contents of which is incorporated herein by reference.

TECHNICAL FIELD

The present specification generally relates to electronic assemblies providing thermoelectric generation and, more particularly, to electronic assemblies including structures for collecting and routing heat flux for thermoelectric generation.

BACKGROUND

A thermoelectric generator is an energy harvesting device that converts thermal energy into electrical energy based on a temperature differential dT between a heated surface and a non-heated surface of the thermoelectric generator. Electrical power scales nonlinearly with the temperature differential dT. As an example, a thermoelectric generator may be directly attached to a heat generating device (e.g., a semiconductor device) to obtain the greatest temperature differential dT. However, typical thermoelectric generator devices produce an electrical output at the mW level, which may not be large enough for some applications. Further, such thermoelectric generator devices are costly. Therefore, attaching a thermoelectric generator device to each heat generating device to achieve a desired electrical output level may be cost prohibitive in some applications.

Accordingly, a need exists for alternative electronic assemblies incorporating a thermoelectric generator device that increase the temperature differential dT and electrical output, as well as reduce the overall cost per mW of electrical output.

SUMMARY

In one embodiment, an electronic assembly includes a substrate having a first surface and a second surface, and a conductive plane and a plurality of thermal guide traces position on the first surface of the substrate. The conductive plane includes a plurality of arms radially extending from a central region. The plurality of thermal guide traces surrounds the conductive plane, and is shaped and positioned to guide heat flux present on or within the substrate toward the central region of the conductive plane.

In another embodiment, an electronic assembly includes a substrate having a first surface and a second surface, a conductive plane on the first surface of the substrate, a thermoelectric generator device, a heat sink thermally coupled to the thermoelectric generator device, a plurality of heat generating devices thermally coupled to the second surface of the substrate, and a plurality of thermal guide traces positioned on the first surface of the substrate. The conductive plane has a plurality of arms radially extending from a central region, wherein each arm of the plurality of arms of the conductive plane has an end portion. The thermoelectric generator device is thermally coupled to the central region of the conductive plane. Each heat generating device of the plurality of heat generating devices is aligned with an individual end portion of an individual arm of the plurality of arms on the first surface of the substrate. The plurality of thermal guide traces surrounds the conductive plane and is shaped and positioned to guide heat flux created by the plurality of heat generating devices toward the central region of the conductive plane.

In yet another embodiment, an electronic assembly includes a substrate having a first surface, a heat pipe structure disposed within the substrate, and a plurality of thermal guide traces positioned on the first surface of the substrate. The heat pipe structure includes a plurality of heating regions fluidly coupled to a cooling region by a plurality of channels arranged in a plurality of arms. The heat pipe structure is configured to receive a working fluid. The plurality of thermal guide traces is shaped and positioned to guide heat flux present on or within the substrate toward the cooling region of the heat pipe structure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION

Referring generally to the figures, embodiments of the present disclosure are directed to electronic assemblies that convert waste heat to electrical power by collecting and routing thermal flux from multiple heat generating devices to one or more thermoelectric generating devices. Rather than coupling a thermoelectric generator to each heat generating device (e.g., an electronic component), heat flux from each heat generating device is collected and routed to a larger thermoelectric generator device that creates electrical power based on a temperature differential between a heated surface and a cooled surface. The heat flux collected and routed from multiple heat generating devices increases the temperature of the heated surface of the thermoelectric generator device. By routing heat flux to a single, larger thermoelectric generator device, efficiency of electrical power generation is increased and the total cost of the assembly is reduced.

Embodiments described herein employ a heat flux collecting and routing structure to collect and route the heat flux to the thermoelectric generator device. In one embodiment, the structure includes a conductive plane and a plurality of thermal guide traces. The conductive plane has a plurality of arms radially extending from a central region that is thermally coupled to the thermoelectric generator device. The plurality of thermal guide traces is configured to optimally guide the heat flux toward the thermoelectric generator device. In another embodiment, a heat pipe structure is used to route heat flux toward a thermoelectric generator device rather than a conductive plane.

Various embodiments of electronic assemblies for thermoelectric power generation are described in detail herein.

Figure 1:
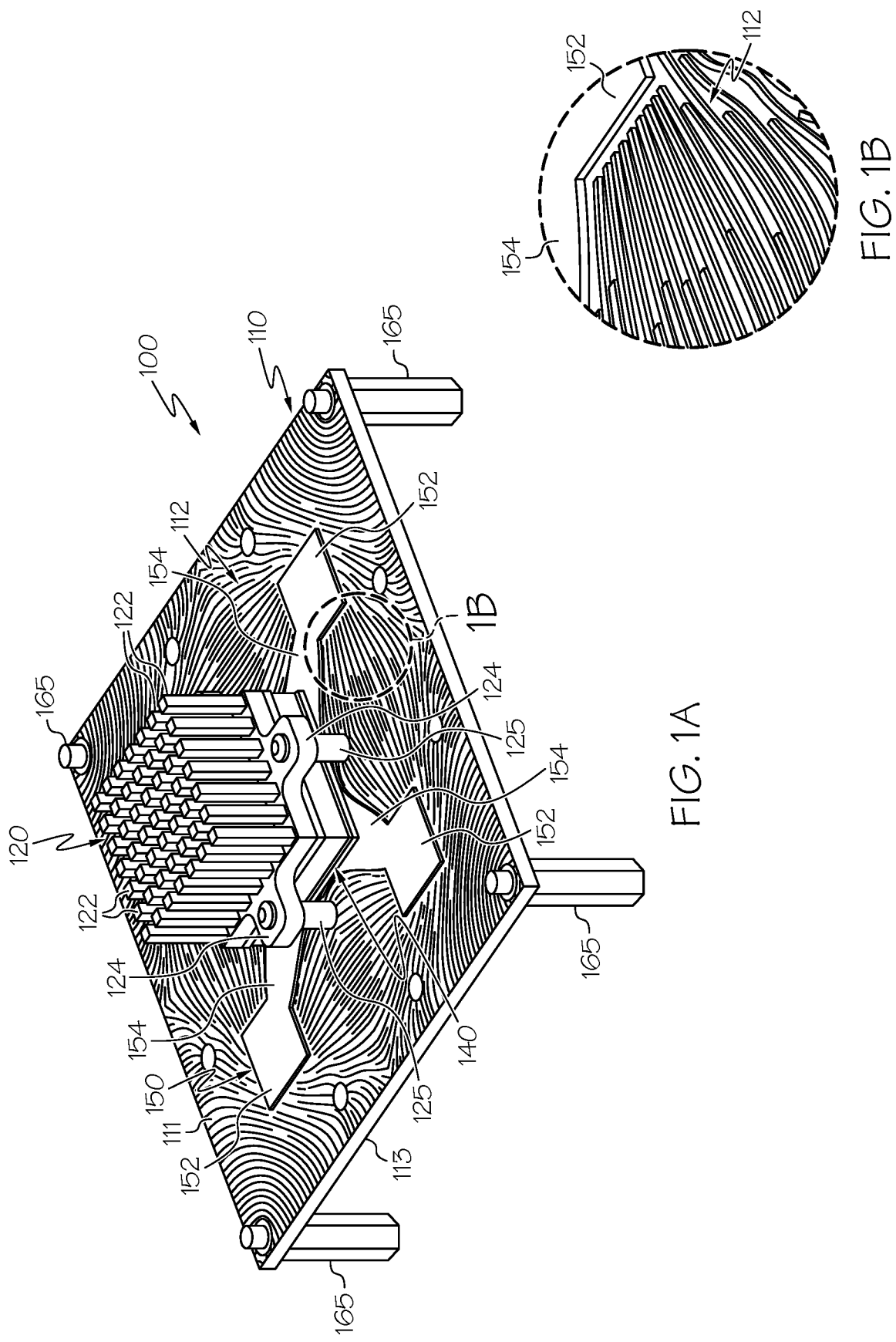
FIG. 1A schematically depicts a perspective view of an example electronic assembly according to one or more embodiments described and illustrated herein.
FIG. 1B schematically depicts a close-up view of a portion of the example electronic assembly illustrated in FIG. 1A according to one or more embodiments described and illustrated herein.

Referring now to FIG. 1A, an example electronic assembly 100 is schematically depicted. The example electronic assembly 100 includes a substrate 110 having a first surface 111 and a second surface 113. The substrate 110 and its associated components and features are configured as an anisotropic heat flow control structure for the efficient collecting and guiding of heat from multiple heat generating devices to a central location. The illustrated electronic assembly 100 further includes, as described in more detail below, a conductive plane 150 on the first surface 111 of the substrate 110, a plurality of thermal guide traces 112 surrounding the conductive plane 150, a thermoelectric generator device 140, a heat sink 120, and a plurality of heat generating devices 170 coupled to the second surface 113 of the substrate 110 (see FIG. 2). The substrate 110 may be fabricated from any suitable material, such as a printed circuit board ("PCB") material. A non-limiting PCB material includes FR-4, for example.

Figure 2:
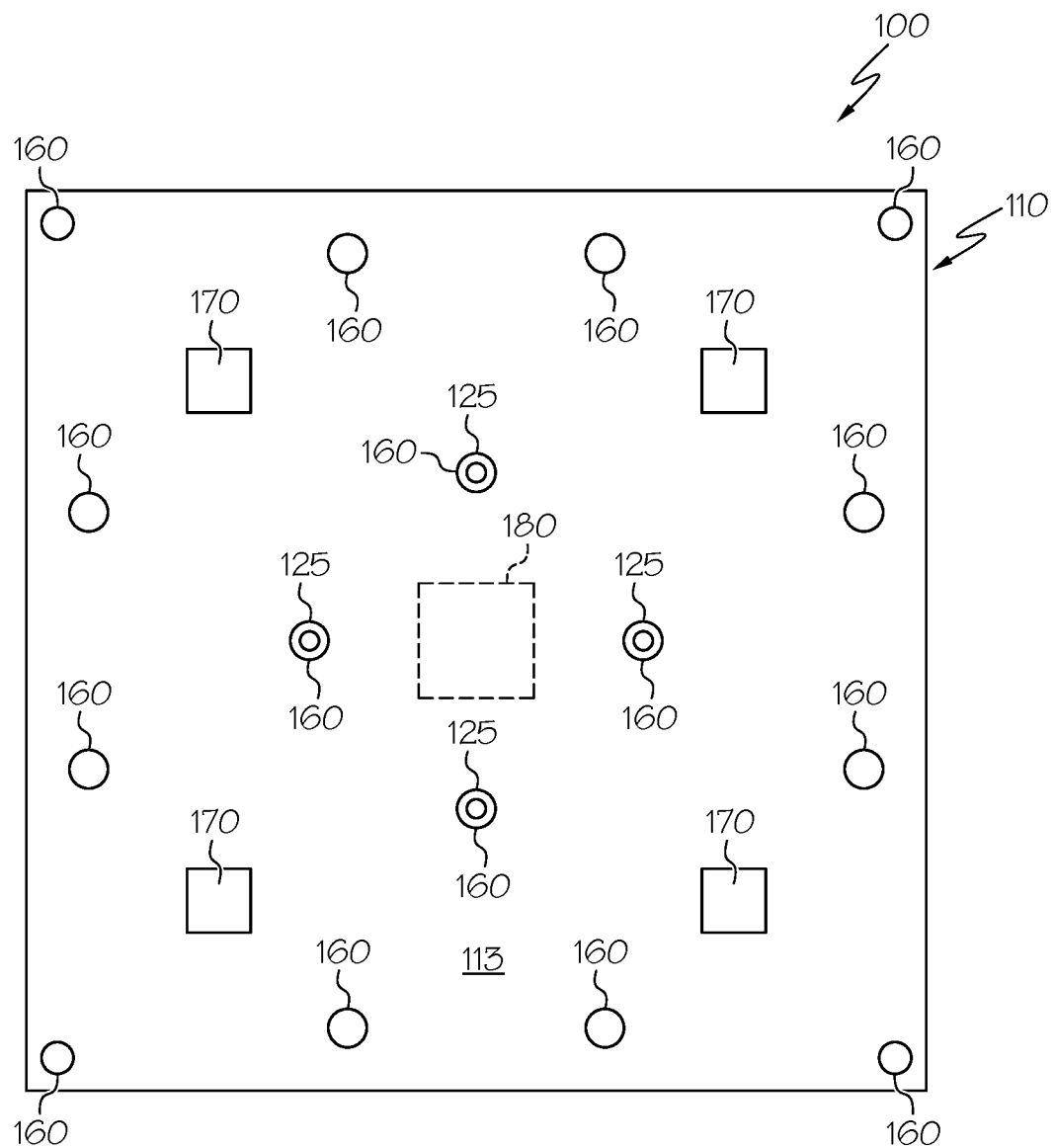
FIG. 2 schematically depicts a second surface of the example electronic assembly illustrated in FIG. 1A according to one or more embodiments described and illustrated herein.

Referring now to FIG. 2, the second surface 113 of the substrate 110 is schematically illustrated. A plurality of heat generating devices 170 is thermally coupled to the second surface of the substrate 110. It should be understood that more or fewer heat generating devices 170 than the four shown in FIG. 2 may be coupled to the substrate 110. Further, the heat generating devices 170 may be arranged on the substrate 110 in a configuration that is different from the configuration shown in FIG. 2. In the illustrated embodiment, four heat generating devices 170 are symmetrically positioned on the second surface 113 of the substrate 110.

The heat generating devices 170 may be any component that generates heat as a waste product. The heat generating devices 170 may be electronic devices, such as, without limitation, semiconductor devices. Example semiconductor devices include, but are not limited to, insulated-gate bipolar transistors, metal-oxide field-effect transistors, integrated circuit components, microcontrollers, and the like. Heat generating devices other than electronic devices may also be coupled to the substrate 110.

Such heat generating devices 170 generate waste heat flux. As described in more detail below, the substrate 110 is configured to preferentially route the heat flux created by the plurality of heat generating devices 170 to a desired location on the substrate 110, where it may be converted to electrical energy, for example.

The example substrate 110 of the example electronic assembly 100 includes through holes 160 for accepting fasteners 165 that may be utilized to couple the electronic assembly 100 to a larger assembly, such as a housing, for example. The illustrated fasteners 165 may act as standoffs with respect to a housing or other larger assembly. The substrate 110 further includes through holes 160 for accepting fasteners 125 for coupling a heat sink 120 to substrate 110. It should be understood that the embodiments described herein are not limited by the type, number, and location of fasteners described and illustrated herein. For example, the heat sink 120 may be coupled to the substrate 110 by any suitable method.

It is noted that the second surface 113 may include additional electrical traces and electrical components disposed in or on one or more substrate layers to provide for a desired circuit; however, such additional electrical traces and electrical components are not shown in the figures for ease of illustration.

Figure 3:
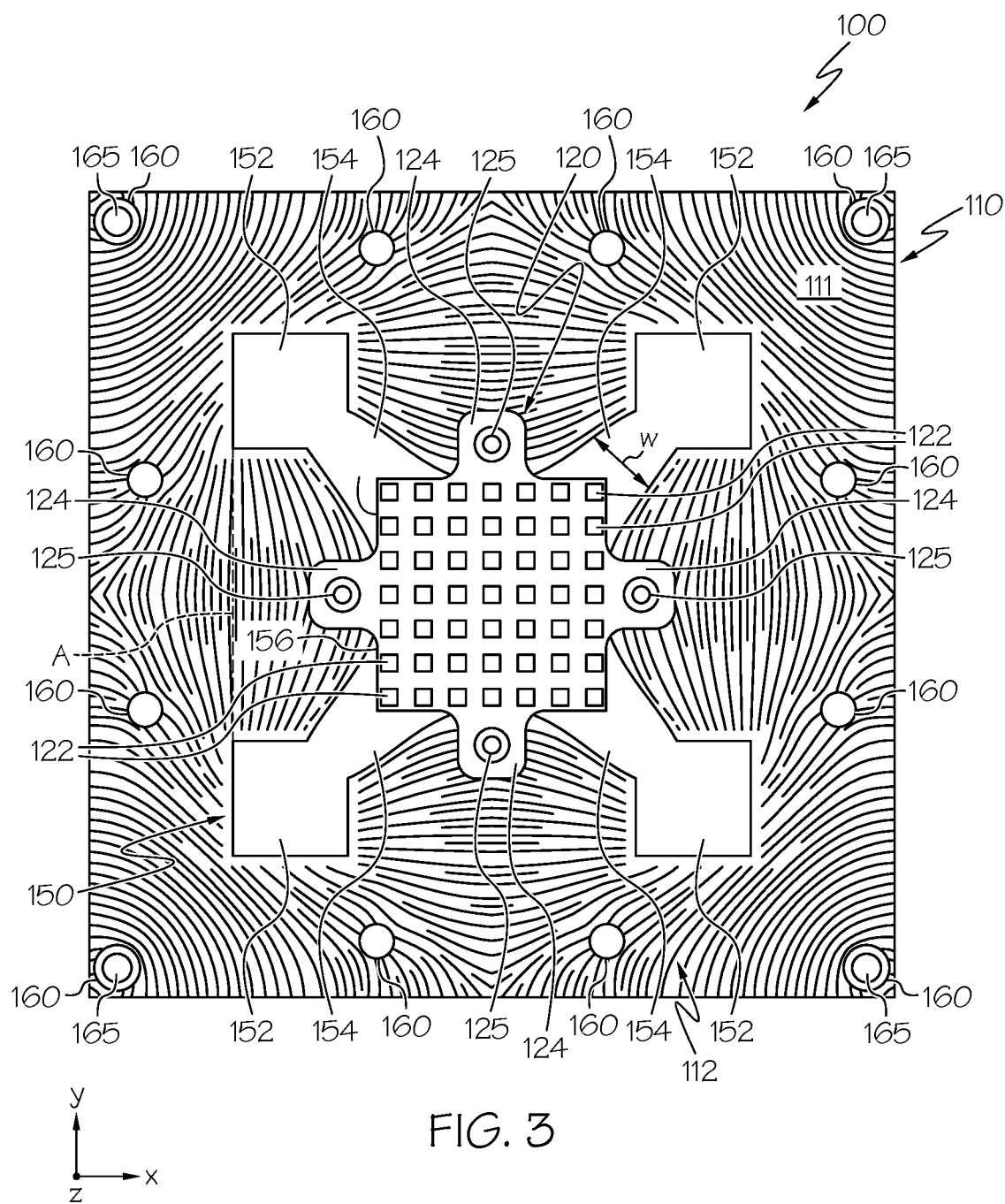
FIG. 3 schematically depicts a first surface and a heat sink of the example electronic assembly illustrated in FIG. 1A according to one or more embodiments described and illustrated herein.

FIG. 3 is a top-down view of the electronic assembly 100 depicted in FIG. 1A. Referring to both FIGS. 1A and 3, a conductive plane 150 is disposed on the first surface 111 of the substrate 110 by any suitable method. In one embodiment, the conductive plane 150 is fabricated from copper. The conductive plane 150 may be fabricated by an etching process, for example. Other thermally conductive materials may be utilized. The example conductive plane comprises a plurality of arms 154 radially extending from a central region 156. As described in more detail below, heat flux created by the plurality of heat generating devices 170 flows through the conductive plane 150 toward the central region 156, which is the desired location for the guided thermal energy.

The number of arms 154 depends on the number of heat generating device 170 coupled to the substrate 110. In the illustrated embodiment, the conductive plane 150 has four arms to correspond to the four heat generating devices. More or fewer arms 154 and corresponding heat generating devices 170 may be provided. Each example arm 154 includes an end portion 152. The end portion 152 of each arm 154 is aligned with an individual heat generating device 170. Accordingly, the end portion 152 is positioned on the first surface 111 of the substrate 110 such that it is directly opposite from an individual heat generating device 170 on the second surface of the substrate 110. In the illustrated embodiment, the end portion 152 of each arm 154 is square in shape. However, embodiments are not limited to such a configuration. Generally, the shape of the end portions 152 may correspond to the shape of the heat generating components 170. The end portions 152 receive heat flux from the respective heat generating components 170 positioned on the opposite surface of the substrate. The heat flux then flows along the arms 154 toward the central region 156.

Because there are four heat generating components 170 symmetrically arranged on the second surface 113 of the substrate 110 in the illustrated embodiment, the conductive plane 150 comprises four orthogonal arms 154 extending from the central region 156. As shown in FIGS. 1A and 3, the example arms 154 have an increasing width w in a direction from the end portion 152 toward the central region 156.

Still referring to FIGS. 1A and 3, a plurality of thermal guide traces 112 are disposed on the first surface 111 of the substrate 110 surrounding the conductive plane 150. FIG. 1B is a close-up view of a region of the substrate 110 shown in FIG. 1A illustrating that the individual thermal guide traces 112 have a height and a width. The plurality of thermal guide traces 112 is represented as simple lines in FIGS. 1A and 3 for ease of illustration. The plurality of thermal guide traces 112 are made of a thermally conductive material, and may be disposed on the first surface 111 of the substrate 110 by any method. In one embodiment, the plurality of thermal guide traces 112 is made of copper, and is formed by etching the first surface 111 of the substrate 110.

The shape, size, configuration, and location of the individual thermal guide traces 112 are such that the thermal guide traces 112, in conjunction with the conductive plane 150 described above, provide an anisotropic heat flow control structure that collects and guides heat from the plurality of heat generating devices 170 toward the central region 156 of the conductive plane 150.

It should be understood embodiments are not limited to the pattern of the plurality of thermal guide traces 112 illustrated in FIGS. 1A and 3. The pattern of the plurality of thermal guide traces 112 depends on a variety of factors, such as the number of heat generating devices 170, the amount of heat generated by the heat generating devices 170, the placement of the heat generating devices 170, the material of the substrate 110, the material of the plurality of conductive traces 112 and the conductive plane 150, and the like. Accordingly, the configuration of the plurality of thermal guide traces 112 may take on any pattern such that heat flux provided by the plurality of heat generating devices 170 is collected and routed to a desired region on the substrate 110 (e.g., the central region 156 of the conductive plane 150).

The pattern of the plurality of thermal guide traces 112 may be determined based on a numerical optimization approach. Any computerized numerical optimization program or algorithm may be utilized to determine the size, shape and placement of the individual thermal guide traces 112 on the substrate 110 to optimally route the heat flux emitted by the heat generating devices 170. Example optimization techniques are described in U.S. Pat. No. 8,516,831 and Dede et al., "*Thermal-composite design optimization for heat flux shielding focusing, and reversal*," Structural and Multidisciplinary Optimization, January 2014, Volume 49, Issue 1, pp 59-68.

Referring particularly to FIG. 3, the configuration of the non-limiting example plurality of individual thermal guide traces 112 of the illustrated electronic assembly 100 will now be described. The plurality of thermal guide traces 112 of the illustrated embodiment is symmetrical about at least two planes extending through a center of the central region 156 of the conductive plane 150. For example, the plurality of thermal guide traces 112 is symmetrical about a plane through the center of the central region 156 along the x-axis and a plane through the center of the central region 156 along the y-axis as shown in FIG. 3. The illustrated plurality of thermal guide traces 112 is also symmetrical about planes extending along opposing arms 154 of the conductive plane 150.

Further, in the example embodiment, individual thermal guide traces 112 between adjacent arms 154 of the conductive plane 150 alternate between having a short length and a long length. Some of the thermal guide traces 112 between adjacent arms 154 also have a radius of curvature (or multiple radii of curvature). As shown in FIG. 3, individual thermal guide traces 112 between adjacent arms 154 comprise a radius of curvature that increases at an increasing distance from an imaginary line A extending between adjacent end portions 152 of the arms 154 of the conductive plane 150. That is, thermal guide traces 112 that are further from the imaginary line A have a radius (or radii) of curvature that is greater than those that are closer to the imaginary line A. As shown in FIG. 3, thermal guide traces 112 proximate a corner of substrate 110 curve from a first edge of the substrate 110 to an adjacent edge.

As stated above, the optimized thermal guide traces 112 are provided on the first surface 111 of the substrate 110 to provide for anisotropic thermal conductivity to, along with the conductive plane 150, collect and guide waste heat from the heat generating devices 170 to a central location or, in some embodiments, multiple desired locations.

Referring once again to FIG. 1A, the electronic assembly 100 further comprises a thermoelectric generator device 140 thermally coupled to the central region 156 of the conductive plane 150. A cooling structure is thermally coupled to a top surface of the thermoelectric generator device 140. In the illustrated embodiment, the cooling structure is configured as a heat sink 120. The example heat sink 120 is configured as a pin-fin heat sink comprising an array of pins 122. The example heat sink 120 has flange portions 124 having through holes through which fasteners 125 are disposed to couple the heat sink 120 and the thermoelectric generator device 140 to the substrate 110.

It should be understood that embodiments are not limited to the type of heat sink illustrated in FIGS. 1A and 3, and that others are possible. It should also be understood that cooling structures other than a heat sink 120 may be utilized, such as a liquid cooling structure, for example.

The thermoelectric generator device 140 is configured to generate electricity from the temperature differential dT between the side of the thermoelectric generator device 140 coupled to the conductive plane 150 and the side of the thermoelectric generator device 140 that is coupled to the cooling structure. Any type of thermoelectric generator device may be utilized. Example, non-limiting examples of thermoelectric generator devices are those sold by Micropelt GmbH of Freiburg, Germany.

Typically, the greater the temperature differential, the greater the electrical output of the thermoelectric generator device. Rather than utilizing an individual thermoelectric generator device 140 on each heat generating device 170, the plurality of thermal traces 112 and the configuration of the conductive plane 150 route heat flux from the plurality of heat generating devices 170 to the central region 156 of the conductive plane 150 and therefore the underside of the single thermoelectric generator device 140. In this manner, the temperature of the heated surface of the thermoelectric generator device 140 is increased, thereby increasing electrical output. Such an electronic assembly 100 may be more cost effective than utilizing a thermoelectric generator device on each heat generating device.

In some embodiments, a temperature insensitive heat generating device 180 (i.e. a component with relatively high operating temperature tolerances) may be thermally coupled to the second surface 113 of the substrate 110 such that it is aligned with (i.e., beneath) the thermoelectric generator device 140 and heat sink 120. Example temperature insensitive heat generating devices include, but are not limited to, silicon carbide power electronics devices and gallium nitride power electronics devices. Heat flux generated by the centrally located temperature insensitive heat generating device 180 may contribute to the heat flux provided to the heated surface of the thermoelectric generator device 140. The temperature insensitive heat generating device 180 is capable of receiving heat flux generated by the surrounding heat generating devices 170.

Although FIGS. 1-5 depict a single, centrally positioned thermoelectric generator device, embodiments are not limited thereto. The conductive plate and plurality of thermal guide traces may be configured to collect and route heat flux to multiple locations and multiple thermoelectric generators.

Figure 6:
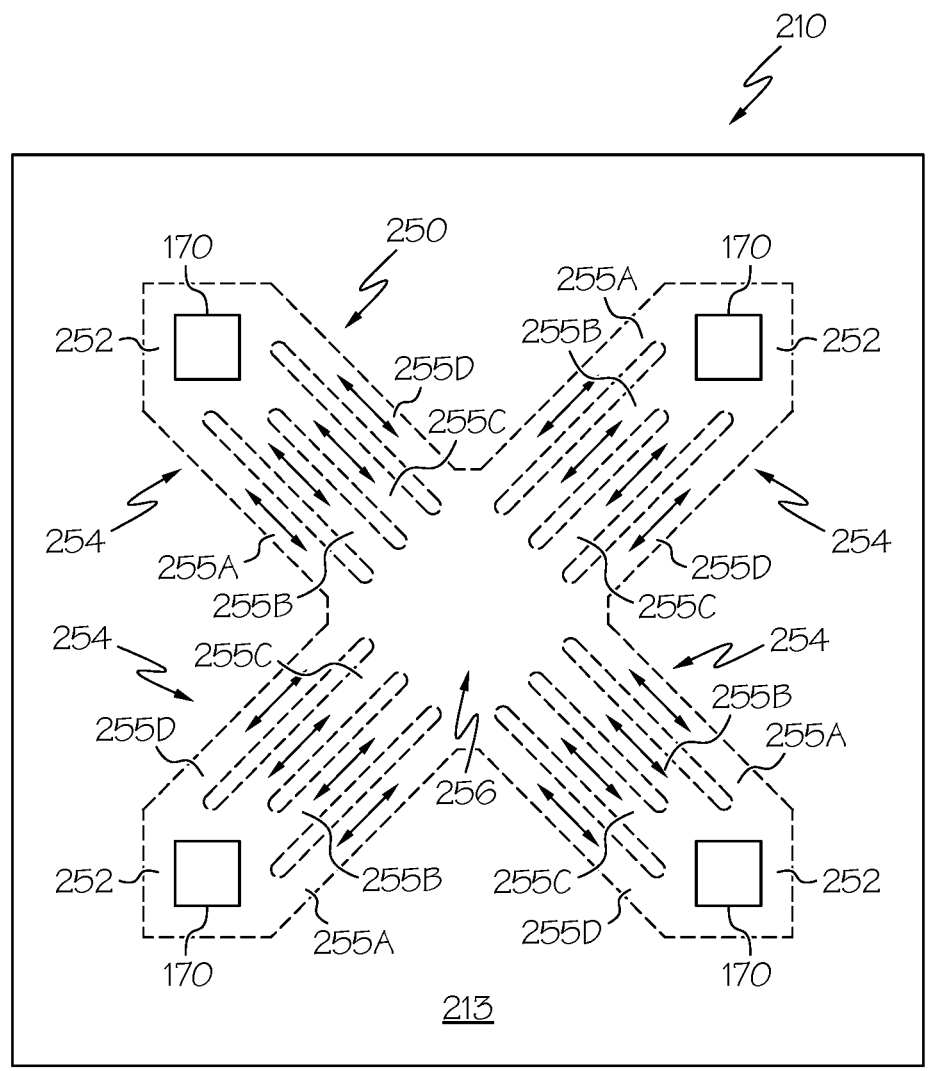
FIG. 6 graphically depicts a second surface of an alternative electronic assembly according to one or more embodiments described and illustrated herein.

FIG. 6 schematically depicts an alternative embodiment wherein the conductive plane 150 of FIGS. 1A and 3 is replaced by a heat pipe structure 250 within a substrate 210. FIG. 6 is a bottom-up view of a second surface 213 of a substrate 210. It is noted that the first surface (not shown) does not include the conductive plane. However, it does include a plurality of thermal guide traces, which may be in the same pattern as illustrated in FIGS. 1A and 3, or in a different pattern.

The heat pipe structure 250 is configured to transfer heat flux from the heat generating devices 170 to the centrally positioned thermoelectric generator. The heat pipe structure 250 may take on any number of configurations. Generally, the heat pipe structure includes a plurality of channels wherein a working fluid is warmed by the heat generating devices 170 and converted into a vapor. The vapor travels toward a condenser region via (e.g., proximate the heat sink 120 or other cooling device as described above) via channels where it is condensed and then returned via a wick structure to one of the heat generating devices 170 where it is warmed once again.

An example heat pipe structure 250 is schematically depicted in FIG. 6. It should be understood that the embodiments are not limited to the heat pipe structure 250 depicted in FIG. 6, and that the heat pipe structure 250 may be configured in any number of ways. Further, it should also be understood that the heat pipe structure 250 depicted in FIG. 6 is a simplified diagram for ease of illustration.

Generally, the heat pipe structure 250 is internal to the substrate 210 and includes four heating regions 252 proximate to the heat generating devices 170. The number of heating regions 252 corresponds to the number of heat generating devices, and any number may be provided. A cooling region 256 is centrally disposed such that it is aligned with the heat sink or other cooling structure. Channels 225A-225D are arranged in arms 254 that fluidly couple the four heating regions 252 to the cooling region 256. It should be understood that any number channels may be provided.

The channels 225A-225D of each arm 254 may be configured as a wick structure having an open core (not shown in FIG. 6). The high operating temperature of the heat generating devices 170 heat the working fluid in the heating regions 252 such that it turns into a vapor. The vapor travels through the open core of the wick structure defining the channels 225A-225D until it reaches the cooling region 256, thereby transferring thermal energy from the heat generating devices 170 to the cooling region 256 and the thermoelectric generator device 140 (not shown in FIG. 6). The cooling structure (e.g., the heat sink 120 depicted in FIGS. 1A and 3) releases thermal energy transferred from the heat generating devices 170 to the environment, which thereby cools and condenses the vapor. The condensed working fluid then travels back to the heating regions 252 through the material of the wick structure of the channels 225A-225D, where it once again receives thermal flux from the heat generating devices 170.

Example

Figure 4:
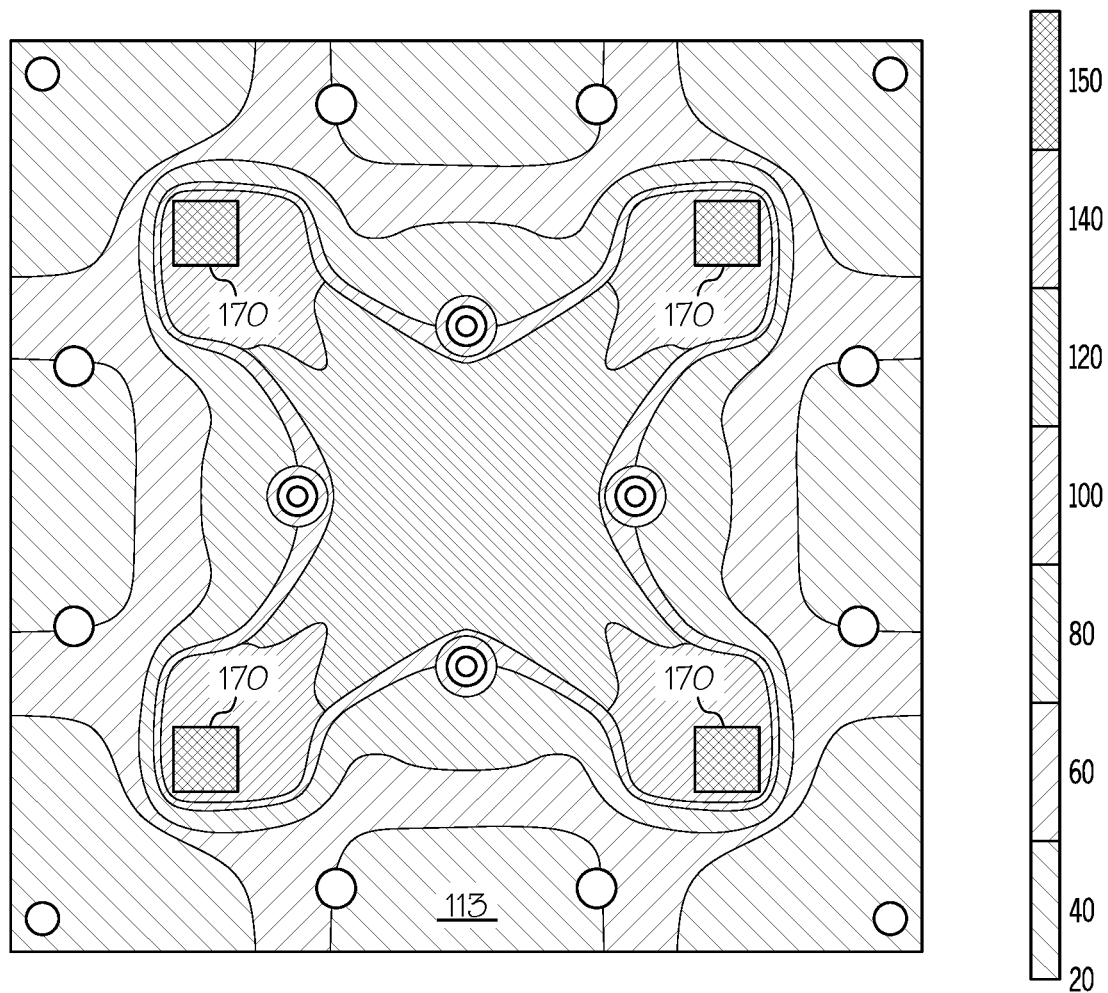
FIG. 4 graphically depicts a thermal map of the second surface of the example electronic assembly illustrated in FIG. 1A according to a steady-state heat transfer simulation.
Figure 5:
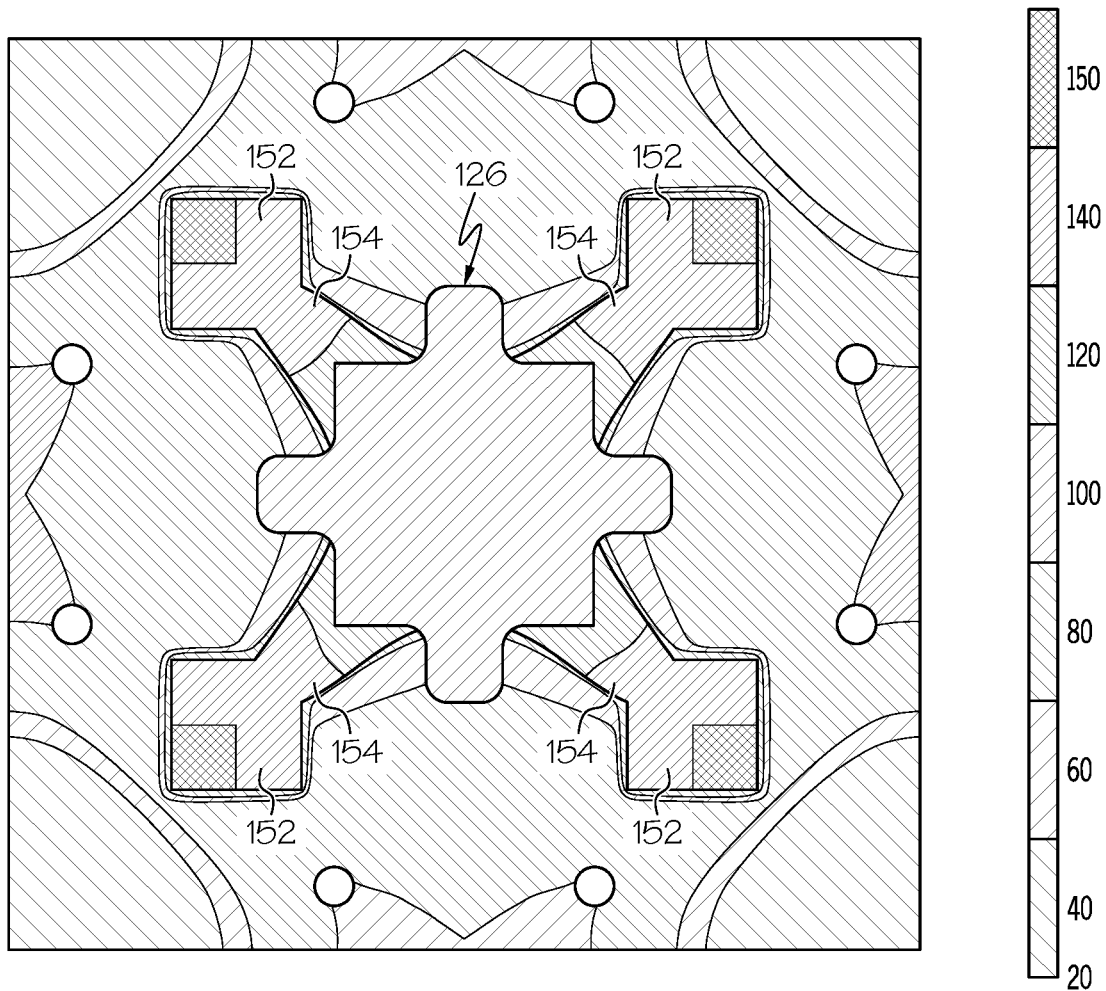
FIG. 5 graphically depicts a thermal map of the first surface of the example electronic assembly illustrated in FIG. 1A according to the steady-state heat transfer simulation of FIG. 4.

FIG. 4 graphically illustrates a thermal map of temperatures on the second surface 113 of the substrate 110 of the electronic assembly 100 depicted in FIGS. 1A-3 according to a steady-state heat transfer simulation. FIG. 5 graphically illustrates a thermal map of temperatures on the first surface 111 of the substrate 110 of the electronic assembly 100 depicted in FIGS. 1A-3 according to the same simulation of FIG. 4. The simulation assumed a 5 W/cm$^2$ heat flux at each heat generating device 170. Heat loss to the ambient environment via free convection was assumed at 5 W/(m$^2$K) at 20 degrees Celsius. The central region 156 provides for a 20 mm by 20 mm area for the thermoelectric generator device 140 and the heat sink 120.

The four heat generating devices 170 were simulated as 5 mm by 5 mm electronic devices attached to a 70 mm by 70 mm PCB substrate including the plurality of thermal guide traces 112 and the conductive plane 150 illustrated in FIGS. 1A, 1B and 3 and described above.

The highest temperature occurs at the heat generating devices themselves, which is about 150 degrees Celsius. Heat is transferred to the conductive plane 150 of the first surface 111 of the substrate 110 as shown by the increased temperatures of the second surface 113 of the substrate 110 opposite from the conductive plane 150. As shown in FIG. 5, heat flux is routed by the plurality of thermal guide traces 112 and the conductive plane 150 to the center of the electronic assembly 100. A temperature differential dT across the thermoelectric generator device 140 was about 20 degrees Celsius. This provides for an ideal output of 50 mW of electrical power.

Comparative Example

In a comparative, baseline simulation, rather than utilizing a single large thermoelectric generator device 140, the conductive plane 150 and the plurality of thermal guide traces 112 as shown in FIG. 1A-5, four individual thermoelectric generator devices were utilized. Particularly, four 5 mm by 5 mm heat generating devices were coupled to a second surface of a 70 mm by 70 mm PCB substrate as described above. A single, continuous copper plane was positioned on the first surface of the PCB substrate. An individual thermoelectric generator device and heat sink assembly was positioned proximate each corner of the first surface of the PCB substrate (i.e., aligned with the individual heat generating devices on the second surface of the PCB substrate).

The same loads and boundary conditions were used in the comparative, baseline example as in the previously described example. A temperature differential dT between the heated and cooled surface of each thermoelectric generating device was calculated as 10 degrees Celsius, which provided about 10 mW per thermoelectric generating device. This yielded a total of 40 mW harvested in the simulation as compared to the 50 mW harvested in the previously described example.

Assuming a cost of $15.00 for each thermoelectric generator device in the comparative example, a figure of merit for the comparative system is approximately 40 mW/$60.00, or 0.67 mW/$.

It is noted that total energy harvested scales roughly linearly with the footprint area of the thermoelectric generator device. The footprint area of the thermoelectric generator device of the previously described example is 1.78 times larger than the footprint area of a single thermoelectric generator device of the comparative example. Assuming a cost of $16.00 for the larger, single thermoelectric generator device, the figure of merit for the previously described example incorporating thermal energy harvesting is approximately 1.78×50 mW/$16, or approximately 5.56 mW/$. This represents an improvement of over 700% as compared to the comparative, baseline example.

It should now be understood that embodiments described herein provide for efficient electrical power production using fewer thermoelectric generator devices (i.e., less thermoelectric generator devices than the number of heat generating devices) and a heat flux collecting and routing structure. The heat flux collecting and routing structure collects and routes heat flux created by the heat generating devices toward the thermoelectric generator device. By routing heat flux from multiple heat generating devices toward a large thermoelectric generator, efficiency is improved over the case where each heat generating device has a thermoelectric generator associated therewith. The structure incorporates thermal guide traces to guide the heat flux toward the thermoelectric generator.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. An electronic assembly comprising:
   a substrate comprising a first surface;
   a heat pipe structure disposed within the substrate and comprising a plurality of heating regions fluidly coupled to a cooling region by a plurality of channels arranged in a plurality of arms, the heat pipe structure configured to receive a working fluid; and
   a plurality of thermal guide traces positioned on the first surface of the substrate and shaped and positioned to guide heat flux present on or within the substrate toward the cooling region of the heat pipe structure; and
   a thermoelectric generator device thermally coupled to the cooling region of the heat pipe structure.

2. The electronic assembly of claim 1, further comprising a cooling structure thermally coupled to the thermoelectric generator device.

3. The electronic assembly of claim 2, wherein the cooling structure comprises a heat sink.

4. The electronic assembly of claim 1, wherein the cooling region is centrally disposed and the plurality of heating regions are disposed distally from the cooling region.

5. The electronic assembly of claim 1, further comprising a plurality of heat generating devices thermally coupled to a second surface of the substrate, wherein each heat generating device of the plurality of heat generating devices is aligned with an individual heating region of the plurality of heating regions of the heat pipe structure.

6. The electronic assembly of claim 5, wherein each of the plurality of heat generating devices is a semiconductor device.

7. The electronic assembly of claim 1, wherein:
   the cooling region of the heat pipe structure comprises a condenser region; and
   one or more of the plurality of channels comprises a wick structure extending between the condenser region and the plurality of heating regions.

8. The electronic assembly of claim 7, wherein:
   the working fluid within the heat pipe structure is heated at one or more of the plurality of heating regions such that the working fluid is converted into a vapor;
   the vapor travels toward the condenser region and condenses to a condensed fluid; and
   the condensed fluid travels via the wick structure towards at least one of the plurality of heating regions.

9. The electronic assembly of claim 1, wherein at least one of the plurality of channels is configured as a wick structure having an open core.

10. The electronic assembly of claim 1, wherein a length of individual thermal guide traces of the plurality of thermal guide traces positioned between adjacent arms of the plurality of arms alternates between a short length and a long length.

11. The electronic assembly of claim 1, wherein individual thermal guide traces of the plurality of thermal guide traces positioned proximate a corner of the substrate curve from an edge of the substrate to an adjacent edge of the substrate.

12. The electronic assembly of claim 1, wherein individual thermal guide traces of the plurality of thermal guide traces positioned between adjacent arms comprise a radius of curvature that increases at an increasing distance from a line extending between an edge of an end portion of adjacent arms.

13. An electronic assembly comprising:
   a substrate comprising a first surface and a second surface;
   a heat pipe structure disposed within the substrate, the heat pipe structure comprising a plurality of heating regions fluidly coupled to a cooling region by a plurality of channels arranged in a plurality of arms, wherein the heat pipe structure is configured to receive a working fluid;
   a thermoelectric generator device thermally coupled to the cooling region of the heat pipe structure;
   a heat sink thermally coupled to the thermoelectric generator device;
   a plurality of heat generating devices thermally coupled to the second surface, each of the plurality of heat generating devices aligned with an individual heating region of the plurality of heating regions; and
   a plurality of thermal guide traces positioned on the first surface of the substrate, wherein the plurality of thermal guide traces is shaped and positioned to guide heat flux generated by the plurality of heat generating devices from at least one of the plurality of heating regions toward the cooling region of the heat pipe structure.

14. The electronic assembly of claim 13, wherein the cooling region is centrally disposed and the plurality of heating regions are disposed distally from the cooling region.

15. The electronic assembly of claim 13, wherein each of the plurality of heat generating devices is a semiconductor device.

16. The electronic assembly of claim 13, wherein:
   the cooling region of the heat pipe structure comprises a condenser region; and
   one or more of the plurality of channels comprises a wick structure extending between the condenser region and the plurality of heating regions.

17. The electronic assembly of claim 16, wherein:
the working fluid within the heat pipe structure is heated at one or more of the plurality of the heating regions such that the working fluid is converted into a vapor;
the vapor travels toward the condenser region and condenses to a condensed fluid; and
the condensed fluid travels via the wick structure towards at least one of the plurality of heating regions.

18. An electronic assembly comprising:
a substrate comprising a first surface;
a heat pipe structure disposed within the substrate, the heat pipe structure comprising a centrally disposed cooling region surrounded by a plurality of radially disposed heating regions fluidly coupled to the cooling region by a plurality of channels comprising a wick structure having an open core, the plurality of channels arranged in a plurality of arms, wherein the heat pipe structure is configured to receive a working fluid;
a plurality of thermal guide traces positioned on the first surface of the substrate, wherein the plurality of thermal guide traces is shaped and positioned to guide heat flux present on or within the substrate toward the cooling region of the heat pipe structure;
a thermoelectric generator device thermally coupled to the cooling region of the heat pipe structure.

19. The electronic assembly of claim 18, further comprising:
a cooling structure thermally coupled to the thermoelectric generator device.

\* \* \* \* \*